US010318184B2

(12) United States Patent
Lee et al.

(10) Patent No.: US 10,318,184 B2
(45) Date of Patent: Jun. 11, 2019

(54) METHOD FOR OPERATING A NON VOLATILE MEMORY OF AN ELECTRONIC DEVICE AND THE ELECTRONIC DEVICE IMPLEMENTING THE SAME

(71) Applicant: Samsung Electronics Co., Ltd, Gyeonggi-do (KR)

(72) Inventors: Woosung Lee, Seoul (KR); Inhwan Song, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/153,633

(22) Filed: May 12, 2016

(65) Prior Publication Data

US 2016/0335011 A1 Nov. 17, 2016

(30) Foreign Application Priority Data

May 12, 2015 (KR) .................... 10-2015-0066201

(51) Int. Cl.
*G06F 1/30* (2006.01)
*G11C 11/56* (2006.01)
(Continued)

(52) U.S. Cl.
CPC .............. *G06F 3/0619* (2013.01); *G06F 1/30* (2013.01); *G06F 1/3287* (2013.01);
(Continued)

(58) Field of Classification Search
CPC .......... G06F 1/30–1/305; G06F 3/0679; G06F 3/0688; G11C 5/141; G11C 2211/5646; G11C 16/105; G11C 16/22–16/225
See application file for complete search history.

(56) References Cited

U.S. PATENT DOCUMENTS 8,885,418 B1* 11/2014 Chung ............... G11C 16/0483
365/185.03
2006/0259718 A1* 11/2006 Paley .................. G06F 11/1072
711/159
(Continued)

FOREIGN PATENT DOCUMENTS

JP 2007-018428 1/2007
KR 10-2009-0042039 4/2009
KR 10-2014-0104617 8/2014

OTHER PUBLICATIONS

European Patent Office, "European Search Report," Application No. 16169460.9-1954, dated Nov. 4, 2016, 15 pages, publisher EPO, Munich, Germany.
(Continued)

*Primary Examiner* — Edward J Dudek, Jr.
*Assistant Examiner* — Andrew Russell

(57) ABSTRACT

Various embodiments of the present disclosure provide a method of operating a non-volatile memory and an electronic device adapted to the method. When the possibility that power will be cut off in the electronic device is low or almost zero, the provision operation (e.g., an LSB backup) is interrupted which is capable of preventing data from being erased against a situation where the power is cut off. The method of managing a storage device includes: transferring an initialization command to a non-volatile memory functionally connected to a storage device; transferring a command for interrupting or executing an LSB backup to the storage device controller included in the non-volatile memory; and interrupting or executing, by the storage device controller, the LSB backup according to the LSB backup interrupt or execute command. Other modifications are provided.

20 Claims, 9 Drawing Sheets

(51) Int. Cl.
*G06F 3/06* (2006.01)
*G06F 11/14* (2006.01)
*G06F 13/24* (2006.01)
*G06F 9/445* (2018.01)
*G06F 11/00* (2006.01)
*G11C 5/14* (2006.01)
*G06F 1/3287* (2019.01)
*G06F 1/3296* (2019.01)
*G11C 16/22* (2006.01)
*G06F 11/30* (2006.01)
*G11C 16/30* (2006.01)

(52) U.S. Cl.
CPC .......... *G06F 1/3296* (2013.01); *G06F 3/0647* (2013.01); *G06F 3/0679* (2013.01); *G06F 9/44505* (2013.01); *G06F 11/004* (2013.01); *G06F 11/1441* (2013.01); *G06F 11/1461* (2013.01); *G06F 13/24* (2013.01); *G11C 5/141* (2013.01); *G06F 11/3058* (2013.01); *G06F 2201/86* (2013.01); *G11C 11/5628* (2013.01); *G11C 16/22* (2013.01); *G11C 16/225* (2013.01); *G11C 16/30* (2013.01); *Y02D 10/171* (2018.01); *Y02D 10/172* (2018.01); *Y02D 10/43* (2018.01)

(56) References Cited

U.S. PATENT DOCUMENTS

| | | |
|---|---|---|
| 2008/0162789 A1 | 7/2008 | Choi et al. |
| 2009/0109786 A1 | 4/2009 | Ye et al. |
| 2013/0117606 A1* | 5/2013 | Anholt ................ G06F 11/1048 714/15 |
| 2013/0173848 A1* | 7/2013 | Lassa ................... G06F 3/0619 711/103 |
| 2013/0322169 A1* | 12/2013 | Goss ..................... G11C 16/22 365/185.02 |
| 2014/0232333 A1 | 8/2014 | Kim et al. |
| 2014/0247682 A1* | 9/2014 | Kursula ............... G06F 1/3275 365/228 |
| 2015/0109859 A1* | 4/2015 | Hsu ..................... G11C 16/225 365/185.03 |
| 2015/0301907 A1* | 10/2015 | Oshinsky ........... G06F 11/1441 711/103 |

OTHER PUBLICATIONS

Jaeil Lee, et al., "Adaptive Paired Page Prebackup Scheme for MLC NAND Flash Memory," IEEE Transactions on Computer Aided Design of Integrated Circuits and Systems, IEEE Service Center, vol. 33, No. 7, XP011551449, Jul. 1, 2014, pp. 1110-1114, publisher IEEE, Piscataway, NJ.

Jie Guo, et al., "Low Cost Power Failure Protection for MLC NAND Flash Storage Systems with PRAM/DRAM Hybrid Buffer", XP058018964, Mar. 18, 2013, 6 pages, publisher Design, Automation and Test in Europe, EDA Consortium, San Jose, CA.

Sanghyuk Jung, et al., "Data loss recovery for power failure in flash memory storage systems," Journal of Systems Architecture 61 (2015) 12-27, vol. 61, No. 1, XP029128322, Nov. 22, 2014, pp. 12-27, publisher Elsevier B.V., Amsterdam, The Netherlands.

Hung-Wei Tseng, et al., "Understanding the Impact of Power Loss on Flash Memory", Design, Automation Conference (DAC), XP031927649, Jun. 5, 2011, pp. 35-40, publisher ACM/EDAC/IEEE.

Yuhui Deng, et al., "Architectures and optimization methods of flash memory based storage systems," Journal of Systems Architecture 57 (2011) 214-227, vol. 57, No. 2, XP028136365, Dec. 14, 2010, pp. 214-227, publisher Elsevier B.V., Amsterdam, The Netherlands.

* cited by examiner

METHOD FOR OPERATING A NON VOLATILE MEMORY OF AN ELECTRONIC DEVICE AND THE ELECTRONIC DEVICE IMPLEMENTING THE SAME

CROSS-REFERENCE TO RELATED APPLICATION AND CLAIM OF PRIORITY

The present application is related to an claims the benefit under 35 U.S.C. § 119(a) of Korean patent application filed on May 12, 2015 in the Korean Intellectual Property Office and assigned Serial number 10-2015-0066201, the entire disclosure of which is hereby incorporated by reference.

TECHNICAL FIELD

Embodiments of the present disclosure relate to a method of efficiently operating a non-volatile memory, and an electronic device adapted to the method.

BACKGROUND

In recent years, mobile electronic devices, such as smartphones, tablet PCs, digital cameras, MP3 players, e-books, etc., have been widely used. Mobile electronic devices are generally equipped with a battery. Batteries for mobile electronic devices are divided into a removable type and a non-removable type according to whether they can be replaced. When a removable battery installed within mobile electronic devices has been discharged, it may be replaced with a fully charged battery. Mobile electronic devices with a removable battery are advantageous in that the removable battery is easily replaced with another. Mobile electronic devices with a removable battery are turned off during the battery replacement. Mobile electronic devices with a non-removable battery do not need to replace their battery with another except under rare circumstances. Therefore, mobile electronic devices with a non-removable battery may experience a power-off situation less frequently than mobile electronic devices with a removable battery.

SUMMARY

To address the above-discussed deficiencies, it is a primary object to provide a method for operating a non volatile memory of an electronic device and the electronic device implementing the same.

Electronic devices may be inadvertently turned off in a specific situation during the usage thereof. In this case, electronic devices may lose temporarily stored data. In particular, electronic devices with a removable battery need to take into account a situation where the built-in battery is inadvertently removed. When electronic devices with a removable battery are turned off as the built-in battery is inadvertently removed, they may lose data currently in use. Regarding provisions against an abrupt power-off situation which results in data loss, parts in charge of the provisions may vary according to whether data in use is located inside/outside a storage device. For example, when data is located outside a storage device, the electronic device may prepare for the data loss via the controller. The controller may include an operating system, a file system, a CPU (Central Processing Unit) or AP (Application Processor), etc. When data is inside a storage device, the electronic device may prepare for the data loss through an LSB backup by a storage device controller within the storage device. Since individual provisions, applied to the controller and the storage device, independently function, they may be redundant (duplicate or excessive). An example of the aforementioned power-off situation is a case where the battery is inadvertently removed from the electronic device while the user is writing a note. In this case, the electronic device may lose part of the data of a note that the user is writing or has written. In this case, the controller needs to recover data related to the system operation. In addition, the controller needs to normally access data that has been normally stored in the storage device. As described above, electronic devices with a removable battery need safeguards for protecting data against an abrupt power-off situation due to a battery removal.

By way of comparison, electronic devices with a non-removable battery may have a lower likelihood that the power is cut off, because of an abrupt battery removal, than electronic devices with a removable battery. That is, electronic devices with a non-removable battery may not need to perform an LSB backup for a situation where they are powered off due to an abrupt battery removal or may have a lower frequency of battery removals. For example, a storage device installed within electronic devices with a non-removable battery may not need to temporarily store data in a specific storage space to protect against an abrupt power-off situation. Electronic devices with a non-removable battery do not need to perform the preparation process internally, thus they can offer increased performance.

The method of operating a non-volatile memory, according to various embodiments of the present disclosure, is implemented to include: transferring an initialization command to a non-volatile memory functionally connected to a storage device; transferring a command for interrupting or executing an LSB backup to the storage device controller included in the non-volatile memory; and interrupting or executing, by the storage device controller, the LSB backup according to the LSB backup interrupt or execute command. The LSB backup may be a process of backing up data, temporarily stored, in a specific storage device, thereby preventing the data from being erased. When interrupting the LSB backup, the electronic device may increase its performance. The method of operating a non-volatile memory determines whether the LSB backup is required and interrupts the LSB backup based on the determination result, thereby increasing the performance of the electronic device.

disclosure To address the above-discussed deficiencies, it is a primary object to provide an electronic device that includes: a non-volatile memory including a Least Significant Bit (LSB) backup module capable of preventing data from being erased and a storage device controller for controlling an LSB backup of the LSB backup module; and a processor for transferring an initialization command to the non-volatile memory and a command for interrupting or executing an LSB backup to the storage device controller.

In accordance with another aspect of the present disclosure, a method of managing a storage device is provided. The method includes: transferring an initialization command to a non-volatile memory functionally connected to a storage device; transferring a command for interrupting or executing an LSB backup to the storage device controller included in the non-volatile memory; and interrupting or executing, by the storage device controller, the LSB backup according to the LSB backup interrupt or execute command.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
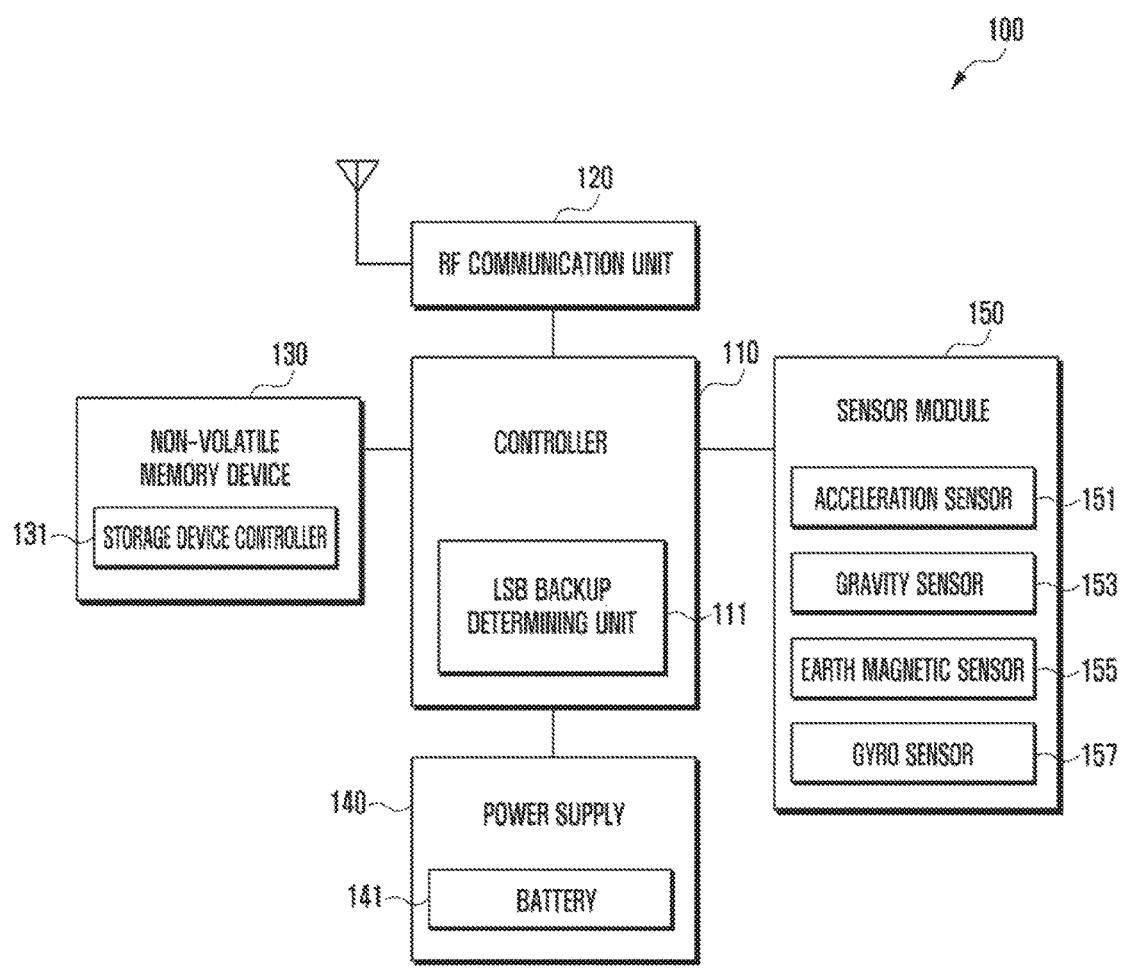
FIG. 1 illustrates block diagram of an electronic device according to various embodiments of the present disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device. Hereinafter, various embodiments of the present disclosure will be described with reference to the accompanying drawings. The present disclosure may have various embodiments, and modifications and changes may be made therein. Therefore, the present disclosure will be described in detail with reference to particular embodiments shown in the accompanying drawings. However, it should be understood that there is no intent to limit the present disclosure to the particular forms, and the present disclosure should be construed to cover all modifications, equivalents, and/or alternatives falling within the spirit and scope of the present disclosure. In describing the drawings, similar elements are designated by similar reference numerals.

It should be understood that the term "module" and "unit" are used for in various embodiments of the present disclosure and are interchangeable with each other.

As used in the present disclosure, the expression "include" or "may include" refers to the existence of a corresponding function, operation, or constituent element, and does not limit one or more additional functions, operations, or constituent elements. Further, as used in the present disclosure, the term such as "include" or "have" may be construed to denote a certain characteristic, number, step, operation, constituent element, component or a combination thereof, but may not be construed to exclude the existence of or the possibility of addition of one or more other characteristics, numbers, steps, operations, constituent elements, components or combinations thereof.

As used in the present disclosure, the expression "or" includes any or all combinations of words enumerated together. For example, the expression "A or B" may include A, may include B, or may include both A and B.

While expressions including ordinal numbers, such as "first" and "second", as used in the present disclosure may modify various constituent elements, such constituent elements are not limited by the above expressions. For example, the above expressions do not limit the sequence and/or importance of the corresponding constituent elements. The above expressions may be used merely for the purpose of distinguishing a constituent element from other constituent elements. For example, a first user device and a second user device indicate different user devices although both are user devices. For example, a first constituent element may be termed a second constituent element, and likewise a second constituent element may also be termed a first constituent element without departing from the scope of the present disclosure.

The expression "battery removal" used in various embodiments is used in the sense that, regarding an electronic device with a removable battery, the built-in battery is removed from the electronic device. The expression "battery removal" may also be used in the sense of a case where a battery installed within an electronic device is removed from the electronic device, in software or from the program point of view, via a procedure of a program installed within the electronic device, as well as a case where a battery installed within an electronic device is physically removed from the electronic device by an external impact, etc. For example, the battery removal by a procedure of a program may refer to a case where the electronic device is turned off and the battery is removed from the electronic device when the cover for the battery is removed. The battery removal by an external impact may refer to a case where the battery is removed from the electronic device while the electronic device is turned on. The electronic device with a removable battery may have a higher possibility of battery removal than the electronic device with a non-removable battery. The electronic device with a removable battery needs to perform an LSB backup to make a provision against an abrupt power-off situation.

The expression "possibility to be powered off" used in various embodiments refers to the probability defined as the measure of the possibility that the power being supplied to an electronic device will be cut off. For example, when the possibility to be powered off in an electronic device with a removable battery is defined as 100, the possibility to be powered off in an electronic device with a non-removable battery may be zero. Electronic devices with a removable battery may experience various types of battery removals, e.g., the battery replacement by the user's operation, an abrupt battery removal due to an external impact. By way of comparison, electronic devices with a non-removable battery are configured in such a way that the battery is embedded in the body, so that the user cannot easily replace the battery with another. That is, electronic devices with a non-removable battery do not allow the battery to be removed from the body as long as they are not disassembled, so that the possibility of battery removal is zero. According to conditions as to whether the built-in battery is a removable battery or a non-removable battery and whether the electronic device satisfies a specific condition, e.g., an LSB backup control condition, the possibility to be powered off may vary. For example, when an electronic device is dropped from a certain height, the possibility to be powered off will be increased in response to the free falling speed. The possibility to be powered off may be divided, based on numbers. When the possibility to be powered off of an electronic device is greater than or equal to a threshold, the electronic device may perform an LSB backup to make a provision against a situation that the power is abruptly cut off.

The expression "data protection" used in various embodiments is used in the sense that data received by an electronic device is stored in a particular storage space to prevent the received data from being lost. That is, protecting data (data protection) may refer to an LSB backing-up operation. For example, 'data protection' (e.g., LSB backup) may refer to a process for a storage device to move and store data, which may be erased as the storage device in use is powered off, into a temporary area in the storage device. That is, 'data protection' may be a process of moving received data to a safe area to protecting the data against situations, e.g., a situation where the electronic device is abruptly powered off.

The terms as used in various embodiments of the present disclosure are merely for the purpose of describing particular embodiments and are not intended to limit the present disclosure. Singular forms are intended to include plural forms unless the context clearly indicates otherwise.

Unless defined otherwise, all terms used herein, including technical terms and scientific terms, have the same meaning as commonly understood by a person of ordinary skill in the art to which the present disclosure pertains. Such terms as those defined in a generally used dictionary are to be interpreted to have the meanings equal to the contextual meanings in the relevant field of art, and are not to be interpreted to have ideal or excessively formal meanings unless clearly defined in the present disclosure.

An electronic device according to various embodiments may be a device including a pen. For example, the electronic device may be one or more of the following: a smart phone, a tablet Personal Computer (PC), a mobile phone, a video phone, an e-book reader, a desktop PC, a laptop PC, a netbook computer, a Personal Digital Assistant (PDA), Portable Multimedia Player (PMP), MP3 player, a mobile medical application, a camera, and a wearable device (e.g., a Head-Mounted-Device (HIVID), such as electronic glasses, electronic clothes, an electronic bracelet, an electronic necklace, an electronic appcessary, an electronic tattoo, and a smart watch).

Hereinafter, an electronic device according to various embodiments will be discussed with reference to the accompanying drawings. The term "a user" as used in various embodiments may refer to any person who uses an electronic device or any other device (e.g., an artificial intelligence electronic device) using an electronic device.

FIG. 1 illustrates block diagram of an electronic device according to various embodiments of the present disclosure.

Referring to FIG. 1, the electronic device 100 is capable of including a controller 110, an RF communication unit 120, a non-volatile memory device 130 (e.g., a non-volatile memory), a power supply 140 and a sensor module 150.

Although it is not shown, the listed components are connected to each other via buses. The controller 110 is capable of transferring signals (e.g., control messages) to the individual components to control them. The controller 110 may be a processor for controlling the components.

The controller 110 is capable of controlling the entire operation of the electronic device 100. For example, the controller 110 is capable of: receiving response signals from the components (e.g., the RF communication unit 120, non-volatile memory device 130, power supply 140 and sensor module 150) via buses; decoding the received response signals; and performing corresponding operations or processing data, based on the decoded results.

The controller 110 may further include an LSB backup determining unit 111. The LSB backup refers to a process where the non-volatile memory device 130 backs up data, which may be erased, in a particular storage space, thereby protecting the data from being erased. The non-volatile memory device 130 may perform (execute) the LSB backup by itself or according to a command transferred from the controller 110. The LSB backup determining unit 111 is capable of receiving information related to an LSB backup from the other components (e.g., the power supply 140 and the sensor module 150), and determining whether the LSB backup is required, based on the received information. In the following description, various embodiments will be described, based on a situation where the power is abruptly cut off, as a condition that an LSB backup is required; however, it should be understood that the present disclosure is not limited to the condition.

Although it is not shown, the controller 110 may further include a Communication Processor (CP) for wireless communication. The CP may be configured to be separate from the controller 110 in the electronic device 100. In this case, the CP enables the electronic device 100 to receive a wireless communication network service under the control of the controller 110. The controller 110 of the electronic device 100 according to various embodiments of the present disclosure controls the LSB backup determining unit 111 to determine whether the LSB backup is required. When the controller 110 ascertains that the LSB backup is not required, it stops performing the LSB backup. In general, the non-volatile memory device 130 (e.g., a NAND flash memory) may be manufactured to perform an LSB backup related to the presence of a situation where data is erased when the power is abruptly cut off. In the present disclosure, when the electronic device 100 is booted, the controller 110 is capable of transferring an initialization command to the non-volatile memory device 130, so that the non-volatile memory device 130 can determine whether it stops or executes (performs) the LSB backup based on the initialization command. For example, the controller 110 determines whether the LSB backup is required. When the controller 110 ascertains that the LSB backup is not required, it controls the non-volatile memory device 130 to stop performing the LSB backup or to reduce the frequency of performing the LSB backup.

The LSB backup determining unit 111 is capable of determining whether the LSB backup is required. For example, the LSB backup determining unit 111 is capable of determining the possibility that the power supplied to the electronic device 100 will be abruptly cut off. When the possibility to be powered off is high, this indicates that an LSB backup is required. In general, electronic devices may be divided into electronic devices with a non-removable battery, from which the battery is not removed, and electronic devices with a removable battery, from which the battery is removed. Electronic devices with a non-removable battery have a possibility of battery removal lower than electronic devices with a removable battery. When the electronic device 100 is turned on, the LSB backup determining unit 111 may identify a type of built-in battery. For example, when the electronic device 100 is manufactured, information regarding the type of built-in battery as a specific code may be stored in a storage space of the electronic device 100. The LSB backup determining unit 111 may identify a type of built-in battery based on the specific code. When the LSB backup determining unit 111 ascertains that the electronic device 100 is an electronic device with a non-removable battery, it determines that the possibility to be powered off in the electronic device is relatively low, and stops performing a provision operation (e.g., an LSB backup) against a case where the power is abruptly cut off. That is, the LSB backup determining unit 111 is capable of commanding a storage device controller 131 of the non-volatile memory device 130 to stop performing the LSB backup being performed in the non-volatile memory device 130. 'Stopping the LSB backup' may be used in the sense of a process for stopping part or all of the preset LSB backup operations. The LSB backup determining unit 111 may also determine whether an LSB backup is required, based on a value measured by the sensor module 150, as well as the type of built-in battery. The LSB backup determining unit 111 may also determine whether an LSB backup is required, based on the remaining battery capacity of a battery 141.

In another embodiment, after the electronic device 100 has been booted, the LSB backup determining unit 111 checks the status of the electronic device 100 and determines whether an LSB backup is required. For example, the controller 110 is capable of determining the ON/OFF of the LSB backup according to the status of data transmission/reception by the electronic device 100. More specifically, when the electronic device 100 needs to perform the transmission/reception of a large amount of data or process particular data at a high speed, the LSB backup determining unit 111 checks the status of data transmission/reception and transfers a command for stopping the LSB backup to the non-volatile memory device 130 via the controller 110. In another embodiment, the controller 110 may make a command to block an LSB backup function at the time that the system is booted, while the non-volatile memory device 130 is being initialized or after the non-volatile memory device 130 has been initialized. More specifically, when the controller 110 commands the non-volatile memory device 130 to perform the initialization and receives the response indicating that the initialization has been completed from the non-volatile memory device 130, it commands the LSB backup determining unit 111 to block the LSB backup function.

The LSB backup determining unit 111 is capable of determining whether an LSB backup needs to be interrupted or executed, based on the current, remaining battery capacity (e.g., battery level) or the power consumption of the electronic device 100. For example, the LSB backup determining unit 111 checks the power consumption of the electronic device 100. When the LSB backup determining unit 111 ascertains that the power consumption is within a particular range, it may request the controller 110 to interrupt or execute the LSB backup. The LSB backup determining unit 111 checks the current, remaining battery capacity (e.g., battery level) of the electronic device 100. When the LSB backup determining unit 111 ascertains that the remaining battery capacity is within a particular range, it may request the controller 110 to interrupt or execute the LSB backup. For example, when the battery 141 of the power supply 140 is relatively low in level or the electronic device 100 enters a low power consumption mode, the LSB backup determining unit 111 may request the controller 110 to execute an LSB backup. The LSB backup determining unit 111 checks the temperature of the electronic device 100. When the LSB backup determining unit 111 ascertains that the temperature of the electronic device 100 is greater than or equal to a particular value, it may request the electronic device 100 to execute an LSB backup. In another embodiment, when the remaining battery capacity of the electronic device with a built-in battery is within a particular range, the LSB backup determining unit 111 may interrupt or execute an LSB backup.

The RF communication unit 120 is capable of including one or more components performing wireless communication between the electronic device 100 and a wireless communication system or between the electronic device 100 and a network connected to other electronic devices. Although it is not shown, the RF communication unit 120 may also include cellular modules (e.g., long-term evolution (LTE), LTE-Advance (LTE-A), code division multiple access (CDMA), wideband CDMA (WCDMA), universal mobile telecommunications system (UMTS), Wireless Broadband (WiBro) or Global System for Mobile Communications (GSM)).

The RF communication unit 120 may further include short-range communication modules, e.g., a wireless fidelity (WiFi) module, a Bluetooth module, a near field communication (NFC) module, or a global positioning system (GPS) module.

The non-volatile memory device 130 is capable of storing application programs required for operations of the listed components, downloaded multimedia content, user data created by the user, Short Message or Multimedia Messages, received from external servers, etc. In the embodiments, the non-volatile memory device 130 may include a storage device controller 131. Although it is not shown, the non-volatile memory device 130 may include an LSB backup module capable of preventing data from being erased.

The non-volatile memory device 130 may include at least one of the following storage media: flash memory type, hard disk type, multimedia card micro memory type, card type of memory (e.g., secure digital (SD) memory, extreme digital (XD) memory, etc.), Random Access Memory (RAM), Static Random Access Memory (SRAM), Read-Only Memory (ROM), Electrically Erase Programmable Read-Only Memory (EEPROM), Programmable Read-Only Memory (PROM), magnetic memory, magnetic disk, optical disk, etc. In the embodiments, the non-volatile memory device 130 may be embedded Multi-Media Card (eMMC) or Universal Flash Storage (UFS), employing a NAND Flash Memory as storage media. NAND flash memory has a vertical cell array structure, and this can be small in size and large in capacity. Due to these advantages, various electronic devices are employing the NAND flash memory. NAND flash memory is divided into Single-level Cell (SLC) type and Multi-level Cell (MLC) type. Single-level Cell is capable of storing 1 bit in a single cell. Multi-level Cell is capable of storing 2 bits or more in a single cell. 3 bit MLC is also called a Triple-Level Cell. In the 2 bit MLC, the upper bit is referred to as a most significant bit (MSB) and the lower bit is referred to as a least significant bit (LSB). In the following description, embodiments are described based on 2 bit MLC, but not limited thereto. That is, the present disclosure is applied to all types of MLC. The eMMC may be implemented as a single memory card including a flash storage device controller and a NAND flash memory chip. The eMMC may also be implemented as a chip on a substrate board as well as a card form. Since the eMMC includes as storage device controller, the controller 110 is capable of efficiently operating the built-in NAND flash memory by communication (commands/responses) with the storage device controller 131. As the non-volatile memory device 130 independently controls the NAND flash memory, the controller 110 reduces the number of components that it needs to control, thereby improving the performance of the electronic device 100. The UFS may be the next generation flash memory manufactured aiming at the higher input/output speed and the lower power consumption than the eMMC.

The storage device controller 131 of the NAND flash memory is capable of storing data in the non-volatile memory device 130 through a temporary storage space (e.g., a buffer memory) in the non-volatile memory device 130. When data is stored in a 2 bit MLC type of NAND flash memory, the electronic device first stores the Least Significant Bit (LSB) and then the Most Significant Bit (MSB) in the memory. When the power is abruptly cut off in a state where the MSB has not been completely stored, the LSB data that has been stored may be lost. In general, the controller 100 has a provision for loss of MSB data during the storage at a time that the power is cut off; however, there is no provision for loss of MSB data that has been stored at a time that the power is cut off. Therefore, as a provision for loss of LSB data, the non-volatile memory device 130 may store LSB data in a temporary storage space in the non-volatile memory device 130 before storing MSB data. In this case, although LSB data is lost when the power is abruptly cut off, the lost LSB data can be recovered. In general, NAND flash memory may be manufactured to perform the provisions described above, in order to prevent data loss due to the presence of a particular situation. The provision for loss of LSB data may be an extra operation in a general situation where the possibility of data loss is relatively low and may thus reduce the overall performance of the electronic device.

The storage device controller 131 of the non-volatile memory device 130 is capable of controlling the storage of data in a flash memory. For example, the storage device controller 131 stores data in a buffer memory and then moves the data into a flash memory. In particular, as a provision for a situation where data that can be lost when the power is abruptly cut off in the electronic device 100, the storage device controller 131 is capable of moving and storing the data in a temporary storage space before storing the data in a flash memory. The NAND flash memory is capable of moving the data stored in the temporary storage space into the non-volatile memory device 130. The storage device controller 131 is capable of managing the history of processes which have been previously performed, e.g., a process for temporarily storing data in the NAND flash memory. Although it is not shown, the non-volatile memory device 130 may further include an LSB backup module. The LSB backup module may assist the non-volatile memory device 130 to perform the operations described above.

The method according to various embodiments of the present disclosure operates an electronic device according to a condition as to whether an LSB backup is required. The method determines whether an LSB backup is required and interrupts part or all of the LSB backup operations when the LSB backup is not required. In general, the NAND flash memory built-in an electronic device continues backing up data that can be erased in order to prevent the data from being lost. The electronic device 100 according to embodiments of the present disclosure is capable of interrupting a process (e.g., an LSB backup) that the NAND flash memory continues backing up data. The electronic device 100 requests the storage device controller 131 of the non-volatile memory device 130 to interrupt the LSB backup in the NAND flash memory, and the storage device controller 131 interrupts the LSB backup. The electronic device 100 interrupts the LSB backup, thereby improving the overall performance.

The power supply 140 is capable of supplying electric power to the electronic device 100. The power supply 140 includes a battery 141. The power supply 140 is capable of checking information regarding the battery 141 in real-time or periodically, and providing the battery information to the controller 110. The battery 141 is fixed in the capacity and the amount of current that it can supply to the electronic device. The electronic device 100 according to embodiments of the present disclosure is a portable type of electronic device with a battery 141. The power supply 140 supplies electric power to the electronic device 100. Although it is not shown, the power supply 140 may be connected to an external power source. The electronic device 100 with a battery 141 as a built-in battery operates using power output from the battery 141. The electronic device 100 may be turned off when the battery 141 is removed therefrom.

The electronic device 100 according to various embodiments of the present disclosure may be divided into an electronic device with a non-removable battery and an electronic device with a removable battery, based on how the battery 141 is built in the electronic device 100. The electronic device with a non-removable battery refers to an electronic device to which the battery 141 is fixed during the manufacturing process, so that the user cannot replace the battery 141 with another. The electronic device with a removable battery refers to an electronic device configured in such a way that it includes a battery 141 and a battery cover covering the battery 141 and allows the user to replace the battery 141 with another while opening the battery cover. The electronic device with a non-removable battery has no possibility of battery removal or a low possibility of battery removal. The electronic device with a removable battery has a high possibility of battery removal. That is, the electronic device with a non-removable battery has a low possibility that the power will be cut off. Meanwhile, the electronic device with a removable battery has a high possibility that the power will be cut off. When the electronic device 100 is an electronic device with a non-removable battery, the possibility to be powered off is relatively low. Therefore, the method of operating the electronic device, according to the present disclosure, can interrupt part or all of the LSB backup operations. By way of comparison, when the electronic device 100 is an electronic device with a removable battery, the possibility to be powered off is relatively high. Therefore, the method of operating the electronic device can perform the LSB backup operation in the electronic device 100.

The sensor module 150 includes an acceleration sensor 151, a gravity sensor 153, an earth magnetic sensor 155 and a gyro sensor 157. The sensor module 150 is built in a specific location of the electronic device 100 and senses the current statues of the electronic device 100. For example, when the electronic device 100 is dropped from a height, the sensor module 150 measures values via the sensors, and the controller 110 ascertains that the electronic device 100 is dropped, based on the sensor values.

The acceleration sensor 151 is capable of measuring the current acceleration of the electronic device 100. For example, the acceleration sensor 151 of the electronic device 100 is capable of measuring the acceleration of the electronic device 100. The controller 110 is capable of determining whether the measured acceleration of the electronic device 100 satisfies a preset LSB backup control condition. The preset LSB backup control condition may be a value or a range of sensed values, set by a manufacturer or a user. When the electronic device 100 is moving at an acceleration satisfying the preset LSB backup control condition, the controller 110 determines whether it executes (performs) an LSB backup. More specifically, the LSB backup control condition by the acceleration sensor may be an acceleration value or a range of acceleration values of the electronic device 100 due to an external impact, at which the power may be cut off.

Like the acceleration sensor 151, the gravity sensor 153, earth magnetic sensor 155 and gyro sensor 157 are capable of measuring values corresponding to the current statuses of the electronic device 100 respectively. The controller 110 is capable of presetting LSB backup control conditions according to the individual sensors and determining whether it performs or interrupts the LSB backup, based on the individual sensor values. The controller 110 may also receive a number of sensor values, in real time, via the sensor module 150, and detect the current status of the electronic device 100.

Although it is not show, the electronic device 100 may also include a battery cover sensor. The battery cover sensor is capable of sensing a status of the battery cover open. When the controller 110 ascertains that the battery cover is open, it determines that the possibility of battery removal is relatively high, and then performs an LSB backup to make a provision for battery removal. The battery cover sensor may be applied to only electronic devices with a removable battery. Since electronic devices with a non-removable battery are manufactured in such a way that the battery 141 cannot be removed therefrom, they may not include the battery cover and the battery cover sensor. That is, the controller 110 may also identify a type of built-in battery included in the electronic device 100 according to whether the electronic device 100 includes the battery cover sensor. The controller 110 may check a type of built-in battery included in the electronic device according to whether the electronic device includes the battery cover sensor and interrupts or performs an LSB backup based on the identified type of built-in battery.

Figure 2:
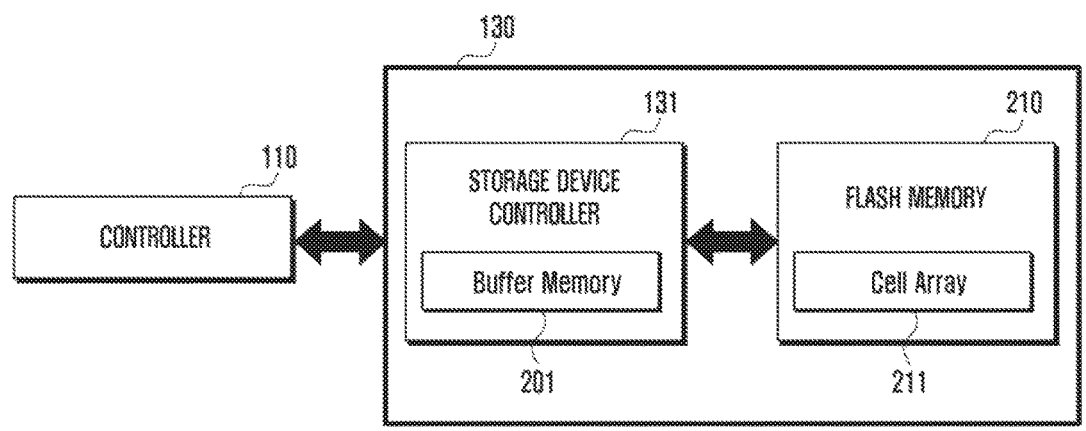
FIG. 2 illustrates a method of storing data in a non-volatile memory device according to various embodiments of the present disclosure.

FIG. 2 illustrates a method of storing data in a non-volatile memory device according to various embodiments of the present disclosure.

Referring to FIG. 2, the controller 110 of the electronic device 100 is capable of controlling the non-volatile memory device 130. The non-volatile memory device 130 is capable of including a storage device controller 131 and a flash memory 210. That is, the controller 110 is capable of controlling operations of the storage device controller 131 and transmitting/receiving signals to/from the storage device controller 131. The storage device controller 131 is capable of saving or loading data in the flash memory 210 of the non-volatile memory device 130. The controller 110 and storage device controller 131, shown in FIG. 2, may be the same as shown in FIG. 1. The flash memory 210 may be included in the non-volatile memory device 130.

The storage device controller 131 may include a buffer memory 201. The flash memory 210 may include a cell array 211. Although it is not shown in FIG. 2, the flash memory 210 may include a decoder, a data buffer, and a control unit. The storage device controller 131 is capable of storing data in the flash memory 210 under the control of the controller 110. More specifically, the storage device controller 131 is capable of storing data in the cell array 211 of the flash memory 210 and also loading the data from the cell array 211. Before storing data in the flash memory 210, the storage device controller 131 may temporarily store the data in the buffer memory 201. The storage device controller 131 temporarily stores data, which needs to be stored in the flash memory 210, in the buffer memory 201, and then moves the data to the flash memory 210. After storing the overall data in the flash memory 210, the storage device controller 131 may delete the data from the buffer memory 201.

The cell array 211 of the flash memory 210 may be configured with a number of memory cells. The memory cells are non-volatile and retain the stored data even after the power is cut off in the electronic device. Memory cells forming the cell array 211 are divided into Single Level Cell (SLC) and Multi-Level Cell (MLC) according to the number of data bits to be stored. The SLC is capable of storing single bit data and MLC is capable of storing data of two or more bits.

A detailed description regarding the SLC storing a single bit in a single memory cell is explained as follows. The SLC has two states according to the distribution of threshold voltages. For example, the SLC may store data 1 or data 0. When data 1 refers to an erase state, data 0 may be a program state. A cell in an erase state may refer to an on cell. A cell in a program state may refer to an off cell. The storage device controller 131 is capable of storing data in the buffer memory 201 and then moving the data to the cell array 211 of the flash memory 210. The storage device controller 131 is capable of performing a program verifying operation to verify whether the data is normally stored in the cell array 211. When the storage device controller 131 ascertains that a program failure occurs from the program verification result, it increases in program voltage, then moves the data into the cell array 211, and performs the program verifying operation.

Figure 3:
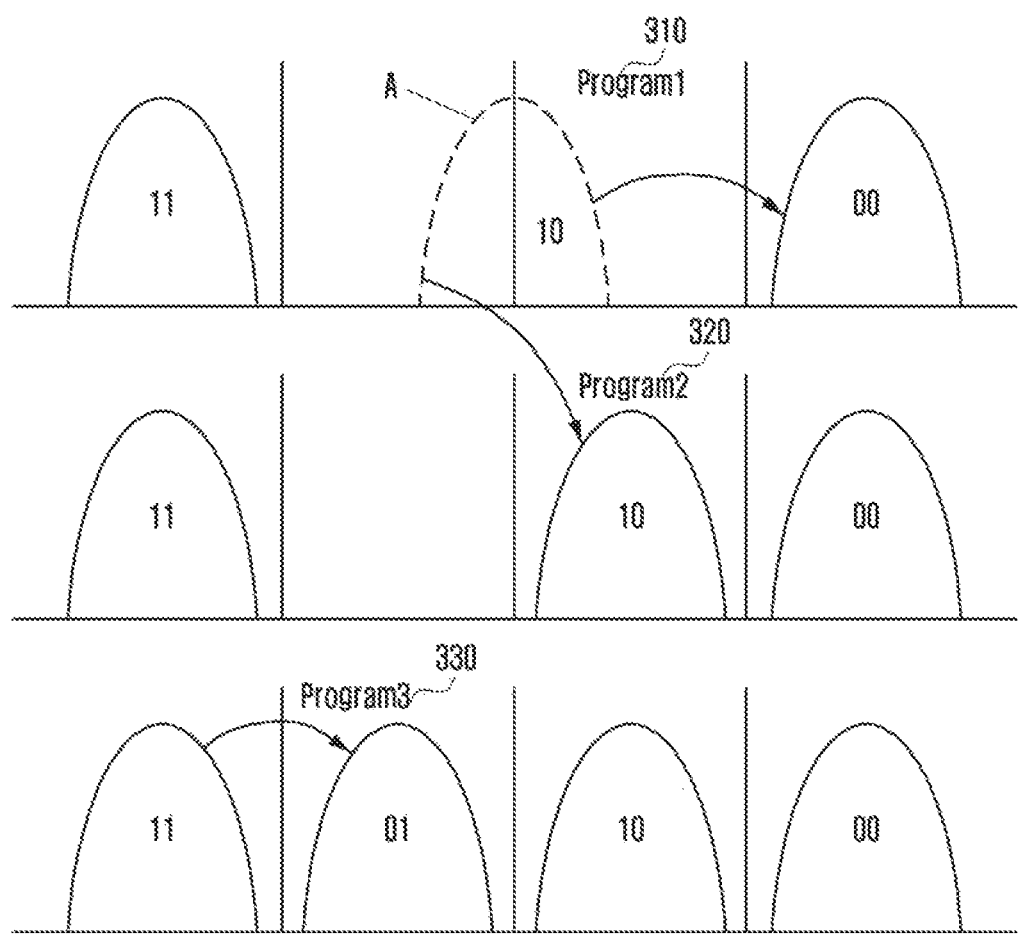
FIG. 3 illustrates examples for explaining a method of storing data in a two-bit multi-level cell (MLC) according to various embodiments of the present disclosure.

A detailed description regarding the MLC storing data of multi-bits in a single memory cell is explained referring to FIG. 3.

FIG. 3 illustrates examples for explaining a method of storing data in a two-bit multi-level cell (MLC) according to various embodiments of the present disclosure.

Referring to FIG. 3, the MLC may be programmed to have one of the four states (e.g., 11, 01, 10, and 00) according to the distribution of threshold voltages. The MLC is capable of storing data of two bits. The data of two bits is stored with the Least Significant Bit (LSB) and Most Significant Bit (MSB). The process for storing data in the LSB of the MLC may be the same as the SLC described above referring to FIG. 2. As shown in FIG. 3, the memory cell of State 11 may be programmed to have State A as dashed line according to LSB data. The memory cell of State A as dashed line may be programmed to have State 00 (Program 1 indicated by reference number 310) or State 10 (Program 2 indicated by reference number 320) according to MSB. The memory cell of State 11 may be programmed to retain State 11 or to have State 01 (Program 3 indicated by reference number 330) according to MSB. The storage device controller 131 may program data of multi-bits in the cell array 211 of the flash memory 210 based on the method described above. That is, the storage device controller 131 first programs the LSB, and then the MSB in the memory cell where the LSB has been programmed. When an error (e.g., a situation where the power is cut off) occurs while programming the MSB in the memory cell where the LSB has been programmed, the programmed LSB may be affected. Although the data in the process of being programmed in the MSB is lost due to the presence of an abrupt error (e.g., a situation where the power is cut off) before the storage device controller 131 has performed the program verifying operation, it may be recovered by the controller 110 via a provision against a situation where the power is cut off. Although the recovery of data fails, the data programmed in the MSB may not affect the operation of the electronic device. Since the data programmed in the LSB does not correspond to data that the controller 110 needs to protect, the controller 110 may store the LSB data in the temporary storage space of the non-volatile memory device 130 so that the LSB data cannot be affected by an error that occurs while the MSB is programmed. Therefore, although an abrupt error occurs in the electronic device 100, the storage device controller 131 may recover the LSB data via the temporary storage space of the non-volatile memory device 130. The data recovery may refer to an 'LSB back up'. The NAND flash memory may be configured to include an LSB backup module (e.g., a circuit module or a software module) and a temporary storage space to continue to perform the LSB backup. That is, since the electronic device 100 continues performing the LSB backup in a situation where no error occurs, this may reduce the overall performance of the electronic device 100. The electronic device 100 according to various embodiments of the present disclosure is capable of controlling the operation of a storage device in response to a possibility to be powered off. For example, when the possibility to be powered off is low or almost zero, the electronic device 100 transfers a signal for interrupting an LSB backup to the storage device controller 131. The storage device controller 131 interrupts the LSB backup under the control of the controller 110, thereby improving the overall performance of the electronic device 100.

In various embodiments of the present disclosure, the controller 110 of the electronic device 100 may control the flash memory to perform or not to perform an LSB backup in order to improve the write performance of the NAND flash memory. The electronic device 100 may set the non-volatile memory device 130 to a state where an LSB backup has not been performed and store the related setting information (e.g., a condition as to whether an LSB backup is performed) in the non-volatile memory device 130, under the control of the controller 110. In another embodiment, the non-volatile memory device 130 may deactivate the LSB backup module included in the non-volatile memory device 130, alter the size or release the settings of a number of temporary storage spaces used for the LSB backup, according to the request of the controller 110 of the electronic device 100. The expression 'deactivation of an LSB backup module' refers to a process for setting the LSB backup module to be in a disenabled state for the future data write process. The LSB backup module may be implemented in software or hardware.

In another embodiment, the non-volatile memory device 130 with an LSB backup circuit may cut off the supply of power to the LSB backup circuit or control the level of voltage applied to the LSB backup circuit. When a data write request is created in the electronic device 100, the non-volatile memory device 130 may be set to perform or not to perform a built-in LSB backup function according to preset states.

In another embodiment, the electronic device 100 may make a command to block an LSB backup function at the time that the system is booted, while the non-volatile memory device 130 is being initialized or after the non-volatile memory device 130 has been initialized. For example, when the electronic device 100 commands the non-volatile memory device 130 to perform the initialization and receives the response indicating that the initialization has been completed from the non-volatile memory device 130, it makes a command to block the LSB backup function.

Figure illustrates a method of interrupting or executing the Least Significant Bit (LSB) backup based on a non-volatile memory device according to various embodiments of the present disclosure.

Figure 4:
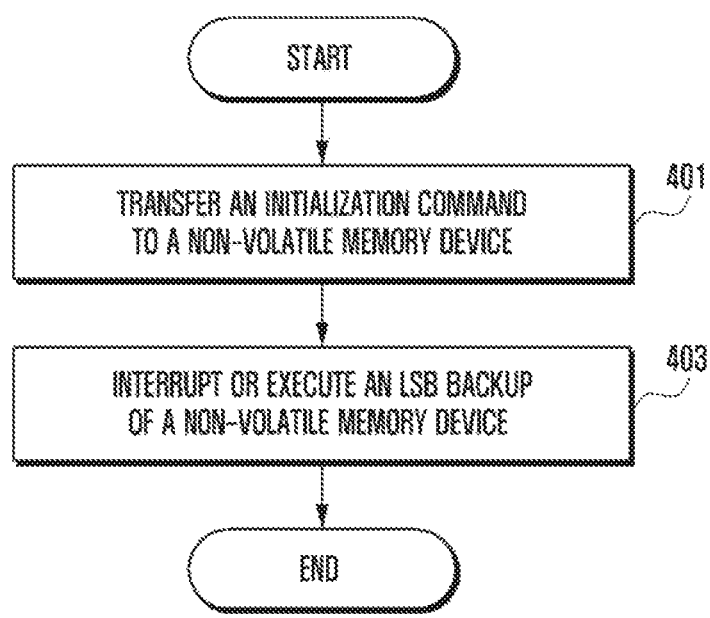
FIG. 4 illustrates a method of interrupting or executing the Least Significant Bit (LSB) backup based on a non-volatile memory device according to various embodiments of the present disclosure.

Referring to FIG. 4, the controller 110 is capable of transferring the initialization command to the non-volatile memory device 130 in operation 401. For example, when the electronic device 100 is initially booted, the controller 110 is capable of transferring the initialization command to the non-volatile memory device 130. The controller 110 is capable of controlling the non-volatile memory device 130 to interrupt or execute an LSB backup in operation 403. As described above, the LSB backup may be interrupted or executed by the storage device controller 131 of the non-volatile memory device 130.

The electronic device 100 according to the present disclosure is capable of transferring the initialization command to the non-volatile memory device 130 and determining whether it interrupts or perform an LSB backup via the non-volatile memory device 130.

Figure 5:
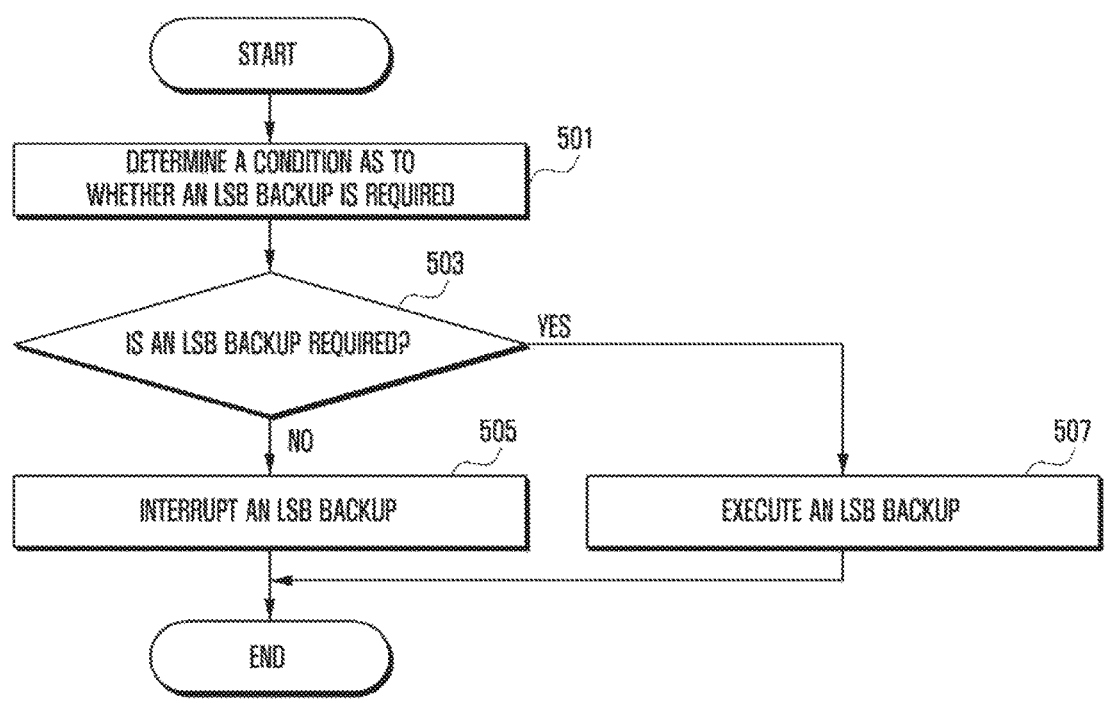
FIG. 5 illustrates a method of operating a storage device based on a condition as to whether an LSB backup is required, according to various embodiments of the present disclosure.

FIG. 5 illustrates a method of operating a storage device based on a condition as to whether an LSB backup is required, according to various embodiments of the present disclosure.

Referring to FIG. 5, the controller 110 is capable of determining whether an LSB backup is required in operation 501. The LSB backup refers to a process for the non-volatile memory device 130 to back up data, which may be erased, in a particular storage space in order to protecting the data from being lost. That is, when the controller 110 determines that data needs to be protected, referring to the states of the electronic device 100, it may perform the control to interrupt the LSB backup. For example, when the electronic device 100 corresponds to a specific condition (e.g., a state where the electronic device 100 is dropped, a state where the electronic device 100 is equipped with a removable battery and the battery cover is open, a user's request, etc.), the LSB backup determining unit 111 of the controller 110 determines that an LSB backup is required. It should be understood that the conditions to determine whether an LSB backup is required are not limited to the embodiments described above. The LSB backup determining unit 111 may also determine whether an LSB backup is required, based on information output from the components of the electronic device 100.

The controller 110 is capable of determining whether an LSB backup is required in operation 503. When the controller 110 ascertains that an LSB backup is not required in operation 503, it may interrupt the LSB backup in operation 505. More specifically, the controller 110 commands the non-volatile memory device 130 to interrupt the LSB backup, thereby stopping the LSB backup. On the other hand, when the controller 110 ascertains that an LSB backup is required in operation 503, it may perform the LSB backup in operation 507. More specifically, the controller 110 commands the non-volatile memory device 130 to execute the LSB backup, thereby performing the LSB backup. Performing an LSB backup is used in the sense that an LSB backup which is running is retained.

In the method of operating a non-volatile memory device according to various embodiments of the present disclosure, the controller 110 determines whether an LSB backup is required and interrupts or executes (performs) the LSB backup based on the determination result. The controller 110 makes a command related to an LSB backup to the non-volatile memory device 130, thereby controlling the non-volatile memory device 130 to interrupt or execute the LSB backup.

Figure 6:
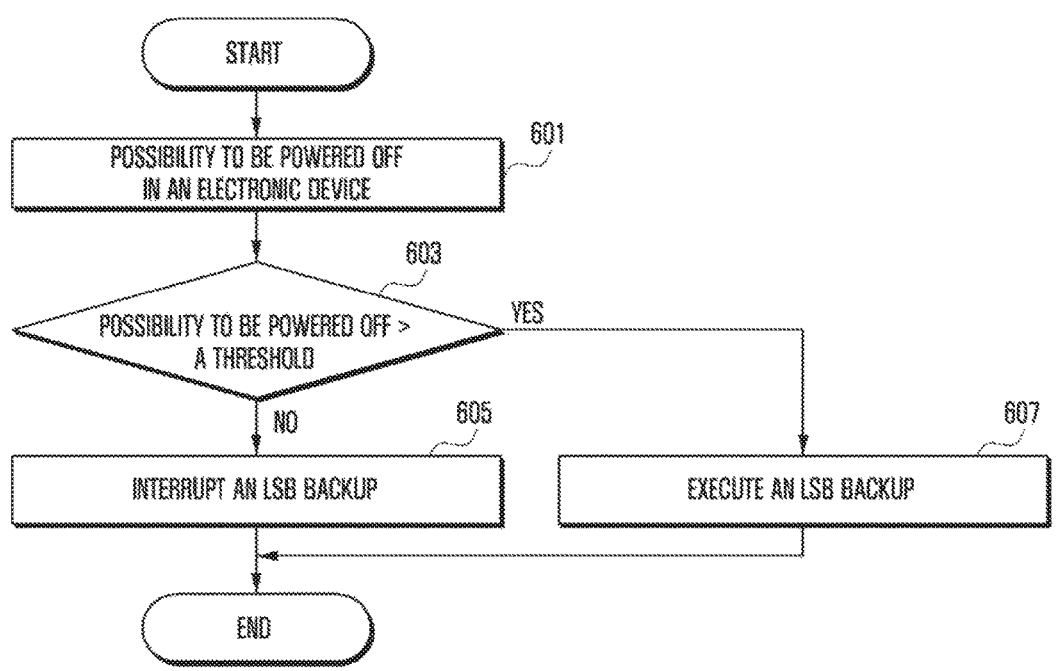
FIG. 6 illustrates a method of checking the possibility to be powered off and operating a storage device in response to the possibility to be powered off, according to various embodiments of the present disclosure.

FIG. 6 illustrates a method of checking the possibility to be powered off and operating a storage device in response to the possibility to be powered off, according to various embodiments of the present disclosure.

Referring to FIG. 6, the controller 110 is capable of checking a possibility that the power will be cut off in the electronic device 100 in operation 601. For example, the electronic device 100 may be a portable electronic device with a battery 141. In the embodiment, the expression 'possibility of battery removal' is also used in the sense of 'possibility to be powered off'. For example, the controller 110 may check a possibility of battery removal, based on a type of built-in battery 141 installed within the electronic device 100 (e.g., an electronic device with a non-removable battery, an electronic device with a removable battery). More specifically, when the electronic device 100 is an electronic device with a non-removable battery, the battery 141 cannot be removed from the electronic device 100. Therefore, the controller 110 determines that the possibility of battery removal is relatively low or almost zero. On the other hand, when the electronic device 100 is an electronic device with a removable battery, the battery 141 may be likely to be removed from the electronic device 100. Therefore, the controller 110 determines that the possibility of battery removal is relatively high. The controller 110 is also capable of checking a possibility of battery removal based on values measured by the sensor module 150, periodically or in real-time. The electronic device 100 is capable of previously storing sensor values corresponding to situations where the power is cut off in the electronic device 100 as the battery 141 is removed from the electronic device 100. The situation where the battery 141 is removed may include a situation where the battery 141 is inadvertently or abruptly removed from the electronic device 100. For example, when the electronic device 100 is dropped or tossed, the battery may be removed from the electronic device 100 due to the impact. Although the embodiment is described based on an electronic device with a removable battery, it should be understood that the present disclosure is not limited thereto. Although the electronic device with a non-removable battery has a low possibility that the battery will be removed, it may be abruptly turned off due to an external impact. Although the embodiment is described in relation to the possibility that the power is cut off in the electronic device 100, this operation may be included in or performed with a process for determining whether an LSB backup is required. The expression 'the possibility to be powered off is large' indicates that an LSB backup needs to be performed. By way of comparison, the expression 'the possibility to be powered off is small' indicates that an LSB backup does not need to be performed.

Although the electronic device with a non-removable battery and the electronic device with a removable battery may have reference values corresponding to the possibility of battery removal, which differ from each other, the controller 110 determines whether the possibility of removable battery is greater than a preset threshold, with respect to both the types of electronic devices, in operation 603. When the controller 110 ascertains that the possibility of removable battery is greater than a preset threshold in operation 603, it determines that an LSB backup (e.g., an LSB backup control operation) corresponding to the battery removal needs to be performed. The LSB backup may be a process for controlling an LSB backup. The preset threshold may be a value or a range of sensed values, preset by the device developer, or a threshold corresponding to a possibility that a battery will be removed from electronic devices. For example, when the controller 110 sets the threshold to 70% and ascertains that the possibility of battery removal is less than 70%, it may interrupt a provision operation against the battery removal. By way of comparison, when the controller 110 ascertains that the possibility of battery removal is greater than or equal to 70%, it may perform an LSB backup. When the possibility to be powered off (the possibility of battery removal) is less than or equal to the threshold in operation 603, the controller 110 may interrupt the LSB backup in operation 605. For example, in a state where the threshold is set to 70%, when the controller 110 ascertains that the possibility of battery removal is 30%, it determines that the possibility that the battery will be removed is low and interrupts the LSB backup. In an embodiment, a number of thresholds may be set in operation 603. In this case, the controller 110 may interrupt the LSB backup, according to levels corresponding to the thresholds, in proportion to the possibility of battery removal.

The controller 110 is capable of controlling the storage device controller 131 to interrupt the LSB backup (e.g., an LSB backup control operation). For example, the controller 110 is capable of storing setup information regarding a condition as to whether an LSB backup is required (performed), and controlling the storage device controller 131 to interrupt the LSB backup, based on the stored setup information. The controller 110 may also control the storage device controller 131 to interrupt the LSB backup, based on a method of altering a level of voltage applied to an LSB backup circuit or cutting off the power supply to the LSB backup circuit.

The LSB backup may be a process for previously moving and storing data, stored in a buffer memory 201, into a temporary storage space of the non-volatile memory device 130 to make a provision against a situation where the battery 141 is abruptly removed from the electronic device 100. The temporary storage space may be included in the storage device controller 131. The temporary storage space may also be included in a memory cell or an internal circuit of the non-volatile memory device 130. The storage device controller 131 is capable of moving and storing data, stored in the buffer memory 201, into a temporary storage space before storing the data in the non-volatile memory device 130. Therefore, the storage device controller 131 can recover data without loss of data even in a situation where power is abruptly cut off. For example, before the MSB is programmed in a cell of a NAND flash memory in a storage device such as eMMC and UFS, the LSB data is moved and stored into a temporary storage space separately allocated to an area in the non-volatile memory device 130. The LSB backup control operation may be an LSB backup.

The data storing process may be performed under the control of the storage device controller 131. For example, the controller 110 of the electronic device 100 may request the storage device controller 131 to store data. While the storage device controller 131 stores data in the flash memory 210, it may store the data in a temporary storage space of the flash memory 210. In order to continue performing the processes described above each time that storage device controller 131 stores data, the storage device controller 131 may continue using part or all of the available traffic in the storage device 130. Therefore, as the processes described above are continuously performed, the overall performance of the non-volatile memory device 130 may be decreased, and this causes the electronic device 100 to lower the performance.

However, the controller 110 interrupts a provision operation against the battery removal in operation 605, thereby improving the performance of the electronic device 100. More specifically, when the controller 110 ascertains that the possibility to be powered off is less than a preset threshold, it requests the storage device controller 131 of the non-volatile memory device 130 to interrupt the LSB backup. The storage device controller 131 interrupts the LSB backup, thereby improving the performance of the electronic device 100.

When the controller 110 ascertains that the possibility to be powered off is greater than a preset threshold in operation 603, it performs the LSB backup in operation 607. As in operation 605, the controller 110 may request the storage device controller 131 to perform the LSB backup in operation 607. That is, the controller 110 may request the storage device controller 131 to continue performing the LSB backup. Although it is not shown, the controller 110 may perform or interrupt part or all of the LSB backup operations.

The electronic device 100 according to various embodiments of the present disclosure is capable of checking a possibility that the power will be cut off in the electronic device 100, and determining whether it interrupts the LSB backup which is running, based on the possibility to be powered off. For example, when the controller 110 of the electronic device 100 ascertains that the possibility to be powered off is less than a preset threshold, it requests the storage device controller 131 to interrupt the LSB backup. The storage device controller 131 controls the non-volatile memory device 130 to interrupt the LSB backup. As the storage device controller 131 interrupts the LSB backup, part of the operations that the non-volatile memory device 130 continues performing is also interrupted, and the performance of the non-volatile memory device 130 is improved. Therefore, the electronic device 100 can improve the overall performance. Although the embodiment is described in such a way that the LSB backup stores data in a temporary storage space before the data is stored in the non-volatile memory device 130, it should be understood that the present disclosure is not limited to the embodiment. The LSB backup may also include processes for preventing data from being lost.

Although it is not shown, the controller 110 of the electronic device 100 according to another embodiment of the present disclosure may determine ON/OFF of the LSB backup based on the states of the electronic device 100. For example, when electronic device 100 is in a state where it transmits/receives (I/O) a large amount of data or performs high speed data processing, such as BurstShot by the built-in camera, the controller 110 may control the storage device controller 131 to interrupt (OFF) the LSB backup. That is, the controller 110 may interrupt (OFF) the LSB backup in order to transmit/receive a large amount of data at a relatively higher rate. The controller 110 checks the power consumption of the electronic device 100. When the controller 110 ascertains that the power consumption is greater than a threshold, it may interrupt the LSB backup in order to reduce the power consumption. The controller 110 checks the temperature of the electronic device 100. When the controller 110 ascertains that the temperature of the electronic device 100 is greater than or equal to a preset value, it may interrupt the LSB backup.

Figure 7:
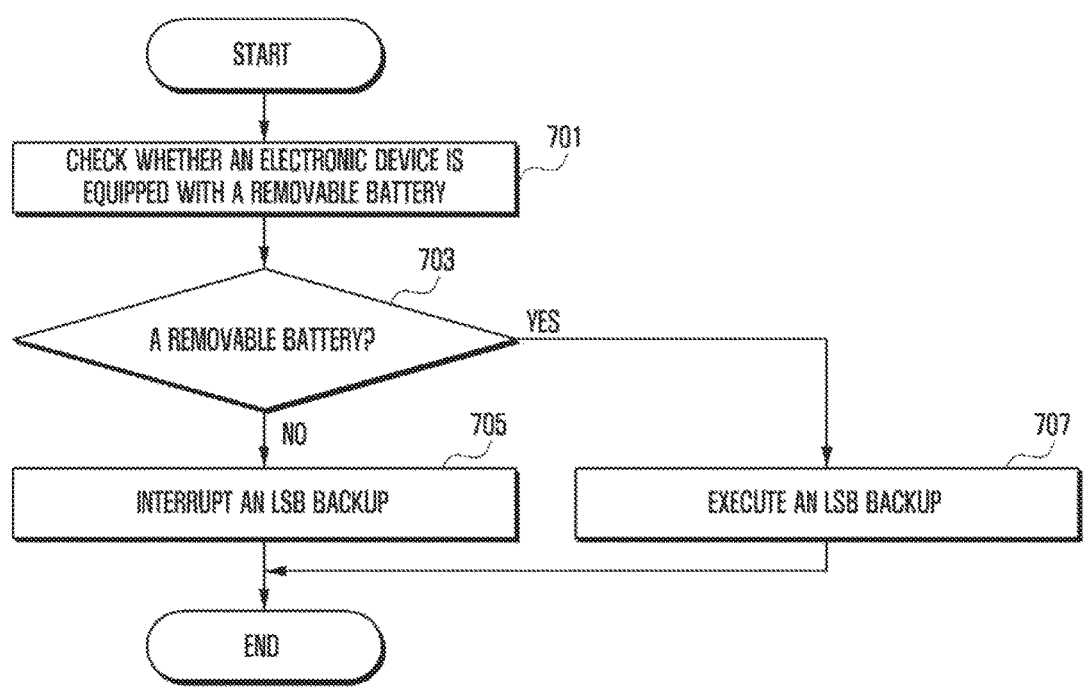
FIG. 7 illustrates a method of protecting erasable data from a removal of a battery, according to various embodiments of the present disclosure.

FIG. 7 illustrates a method of protecting erasable data from a removal of a battery, according to various embodiments of the present disclosure.

Referring to FIG. 7, the controller 110 of the electronic device 100 is capable of checking whether the electronic device 100 is an electronic device with a removable battery in operation 701. When the electronic device 100 is turned on, the controller 110 is capable of checking a type of built-in battery of the electronic device 100. More specifically, the electronic device 100 is manufactured in such a way as to record a code for checking a type of built-in battery in the storage device. When the electronic device 100 is turned on, the controller 110 checks whether the electronic device 100 is an electronic device with a non-removable battery or an electronic device with a removable battery, based on the stored code. The controller 110 checks whether the electronic device 100 is an electronic device with a removable battery in operation 703.

When the controller 110 ascertains that the electronic device 100 is not an electronic device with a removable battery in operation 703, it may request the storage device controller 131 to interrupt an LSB backup operation 705. When the electronic device 100 is not an electronic device with a removable battery, this indicates that the electronic device 100 is an electronic device with a non-removable battery. That is, when the controller 110 ascertains that the electronic device 100 is not an electronic device with a non-removable battery, it may determine that an LSB backup does not need to be performed or the necessity of an LSB backup is low. The controller 110 may request the storage device controller 131 to interrupt the LSB backup. Although it is not shown, the storage device controller 131 may interrupt the LSB backup in response to the request. The LSB backup may refer to a process for the storage device controller 131 to move and store data, which can be erased, into a temporary storage space, not the flash memory 210, thereby preventing the data from being lost. It should be understood that the 'LSB backup' is not limited to a process for backing up data. In the embodiment, the 'LSB backup' may be a process for the storage device controller 131 to perform a provision operation against an abrupt error (e.g., a situation where the power is abruptly cut off) in order to store complete data in the non-volatile memory device 130. The storage device controller 131 of the non-volatile memory device 130 may interrupt part or all of the operations continuously using the traffic, in response to the request for interrupting an LSB backup in operation 705. Therefore, as the LSB backup is interrupted by the storage device controller 131, the electronic device 100 can improve its overall performance.

When the controller 110 ascertains that the electronic device 100 is an electronic device with a removable battery in operation 703, it may retain the LSB backup in operation 707. An electronic device with a removable battery may be configured to include a battery cover for allowing the user to easily replace the battery with another. An electronic device with a removable battery may have a higher possibility that the battery is removed from the electronic device due to an external impact than an electronic device with a non-removable battery. To this end, the controller 110 may retain the LSB backup to protect data completely in operation 707. Although the 'LSB backup' in operation 705 is described as it is similar to a data backup, it should be understood that the LSB backup is not limited thereto.

Figure 8:
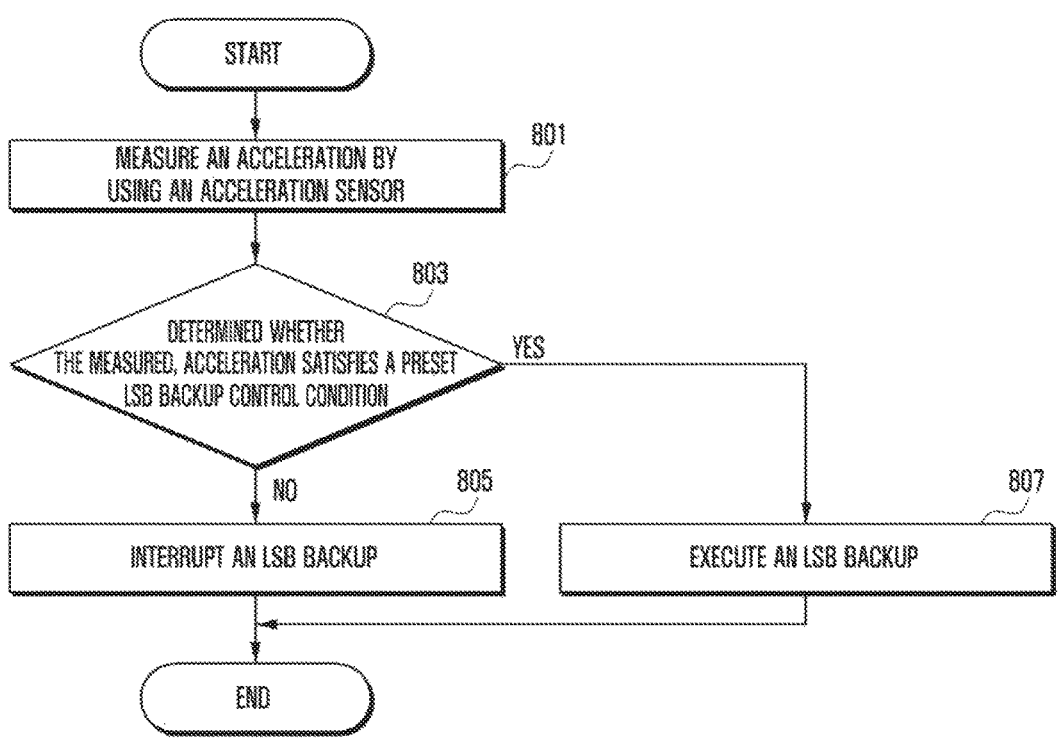
FIG. 8 illustrates a method of measuring an acceleration of an electronic device based on a sensor module and protecting data, based on a condition as to whether the measured acceleration satisfies an LSB backup control condition, according to various embodiments of the present disclosure.

FIG. 8 illustrates a method of measuring an acceleration of an electronic device based on a sensor module and protecting data, based on a condition as to whether the measured acceleration satisfies an LSB backup control condition, according to various embodiments of the present disclosure.

Referring to FIG. 8, the controller 110 is capable of measuring the acceleration (e.g., a sensed value) of the electronic device 100 by using the acceleration sensor 151 of the sensor module 150 in operation 801. For example, when the electronic device 100 is dropped from a height, the acceleration sensor 151 is capable of measuring the acceleration. The sensor module 150 is capable of including an acceleration sensor 151, a gravity sensor 153, an earth magnetic sensor 155, and a gyro sensor 157. The controller 110 is capable of obtaining corresponding sensed values by using the sensors of the sensor module 150.

The controller 110 is capable of determining whether the measured acceleration satisfies a preset LSB backup control condition in operation 803. The preset LSB backup control condition may be a sensor value or a range of sensed values that the device developer has previously stored in the non-volatile memory device 130, in order to determine a situation where the battery 141 is removed from the electronic device 100. The LSB backup control condition may be sensor values corresponding to one or more sensors. That is, when an acceleration measured by the acceleration sensor 151 does not satisfy the preset LSB backup control condition, the controller 110 may determine that the LSB backup needs to be interrupted. Although the embodiment is described based on the acceleration sensor 151, it should be understood that the present disclosure may be implemented by employing a number of sensors. In order to employ sensor values measured by a number of sensors, the present disclosure may be implemented in such a way as to use a number of reference sensor values stored in the non-volatile memory device 130.

When the controller 110 ascertains that the measured acceleration does not satisfy a preset LSB backup control condition in operation 803, it may request the storage device controller 131 to interrupt an LSB backup in operation 805. The process for interrupting an LSB backup in operation 805 is the same as the process for protecting data as in operations 705 and 707 of FIG. 7. That is, when the controller 110 ascertains that the measured acceleration does not satisfy a preset LSB backup control condition, it may not perform an LSB backup. Therefore, the electronic device 100 can improve its performance. The preset power-off condition of operation may include a number of LSB backup control conditions. The controller 110 may perform one LSB backup control condition corresponding to the measured acceleration from among the LSB backup control conditions. For example, the LSB backup control condition includes a number of conditions. In this case, the LSB backup control condition is divided into sub LSB backup control conditions and set as the divided conditions. For example, when a possibility to be powered off is employed as an LSB backup control condition, it may be divided into 30%, 50%, 70%, etc. The controller 110 determines the possibility to be powered off based on the measured acceleration, and skips or adds part or all of the LSB backup operations (e.g., a data backup) corresponding to the determined, possibility to be powered off.

When the controller 110 ascertains that the measured acceleration satisfies a preset LSB backup control condition in operation 803, it may retain the LSB backup in operation 807. More specifically, when the controller 110 ascertains that an LSB backup is required in operation 803, it may request the storage device controller 131 to retain the LSB backup in operation 807. That is, the controller 110 transfers a signal to the storage device controller 131, thereby retaining the LSB backup for protecting data completely. The LSB backup may be a process for protecting data from being erased against a situation where the power is abruptly cut off in the electronic device 100. For example, before the storage device controller 131 stores data in the non-volatile memory device 130, it may store the data in a temporary storage space. More specifically, when an NAND flash memory is employed, the storage device controller 131 may store LSB data in the temporary storage space before storing the LSB data in the non-volatile memory device 130. The temporary storage space may be allocated to an area of the flash memory 210. Therefore, although power is abruptly cut off, the storage device controller 131 may recover the LSB data from the temporary storage space. The LSB backup control condition may include various LSB backup conditions to perform part or all of the LSB backup operations, in response to the necessity of an LSB backup. The method according to various embodiments of the present disclosure enables the electronic device 100 to interrupt the LSB backup for protecting data completely in operation 805, thereby efficiently operating the electronic device 100. That is, the performance of the electronic device 100 improves more when the LSB backup is interrupted according to the conditions than when the LSB backup is continuously performed. Although the embodiment is described in such a way that the possibility to be powered off is determined by using the acceleration sensor, it should be understood that the present disclosure is not limited thereto. In various embodiments of the present disclosure, the method of operating a storage device may also employ a gravity sensor, an earth magnetic sensor, a gyro sensor and a battery cover sensor, as well as the acceleration sensor, to obtain (measure) sensor values, and compare the obtained sensor values (measured sensor values) with one or more reference sensor values. The number of reference sensor values is one or more. The controller 110 compares the measured sensor value with a reference sensor value and determines whether an LSB backup is required based on the comparison result.

The controller 110 may skip or add part or all of the LSB backup operations, based on an LSB backup control condition corresponding to the necessity of an LSB backup.

Although it is not shown, the electronic device 100 according to various embodiments of the present disclosure may turn ON/OFF a provision operation against a situation where power is cut off, based on whether the electronic device 100 is an electronic device with a removable battery or an electronic device with a non-removable battery, and also turn ON/OFF an LSB backup, based on the state of data transmission/reception. After completing the booting procedure for the electronic device 100, the controller 110 may check the states of the electronic device 100. For example, when the electronic device 100 is downloading a large size of file, the controller 110 checks the state of the electronic device 100 and controls the storage device controller 131 to turn OFF the LSB backup. When the controller 110 needs to temporarily process data at high speed, such as BurstShot by the built-in camera of the electronic device 100, it may turn OFF the LSB backup.

Figure 9:
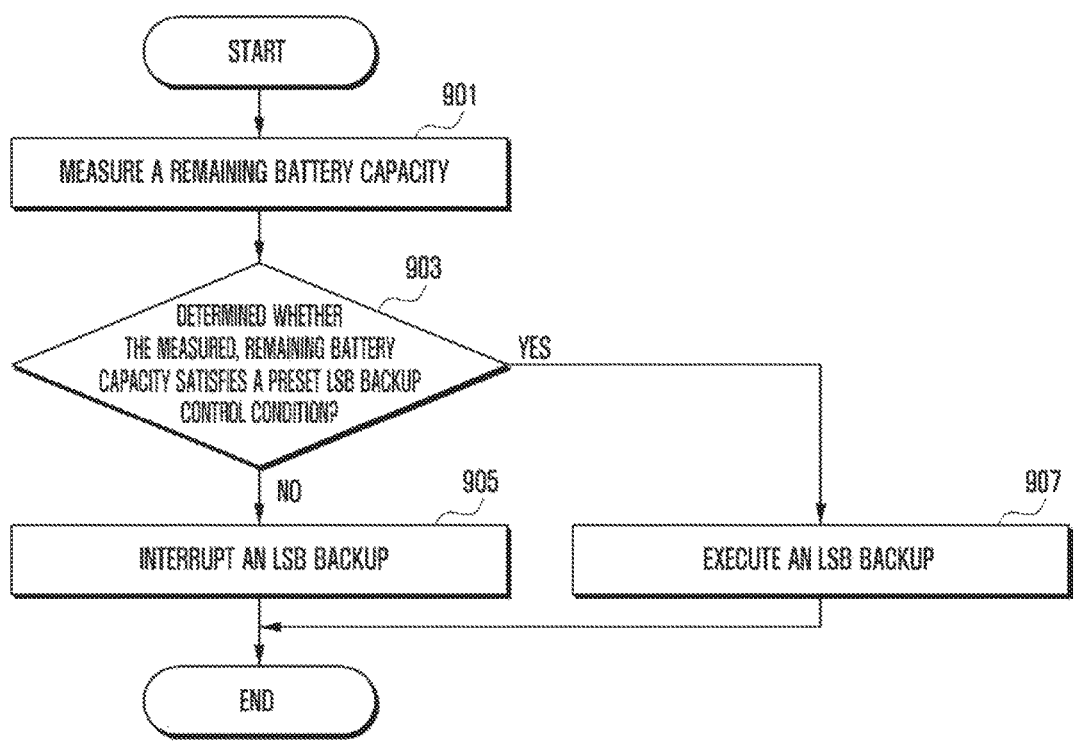
FIG. 9 illustrates a method of measuring the remaining battery capacity and protecting data based on a condition as to whether the measured, remaining battery capacity satisfies an LSB backup control condition, according to various embodiments of the present disclosure.

FIG. 9 illustrates a method of measuring the remaining battery capacity and protecting data based on a condition as to whether the measured, remaining battery capacity satisfies an LSB backup control condition, according to various embodiments of the present disclosure.

Referring to FIG. 9, the controller 110 is capable of measuring the remaining capacity of the battery 141 in operation 901. For example, the controller 110 is capable of receiving information regarding the battery 141 from the power supply 140. The controller 110 is capable of measuring the remaining capacity of the battery 141, based on the received information regarding the battery 141.

The controller 110 is capable of determining whether the measured remaining capacity of the battery 141 satisfies a preset LSB backup control condition in operation 903. The LSB backup control condition may be a condition that the possibility that power will be cut off in the electronic device 100 is relatively since the battery 141 is discharged.

When the controller 110 ascertains that the measured remaining capacity of the battery 141 does not satisfy a preset LSB backup control condition in operation 903, it may interrupt the LSB backup in operation 905. For example, in a condition that the LSB backup control condition is less than the battery remaining capacity of 10%, when the measured remaining capacity of the battery 141 is 20%, the controller 110 interrupts the LSB backup. That is, since the remaining capacity of the battery 141 does not reach the LSB backup control condition, the controller 110 determines that the LSB backup for continuously protecting data does not need to be performed. Therefore, the controller 110 interrupts the LSB backup, so that the electronic device can extend its power maintaining time.

On the other hand, when the controller 110 ascertains that the measured remaining capacity of the battery 141 satisfies a preset LSB backup control condition in operation 903, it performs the LSB backup in operation 907. For example, in a condition that the LSB backup control condition is less than the battery remaining capacity of 10%, when the measured remaining capacity of the battery 141 is 8%, the controller 110 performs the LSB backup. That is, since the electronic device 100 may be turned off when the remaining capacity of the battery 141 is lower than the operation power of the electronic device 100, the controller 110 determines that the LSB backup for protecting data needs to be performed. The controller 110 performs the LSB backup, thereby protecting data that can be erased in operation 907.

The method of operating a non-volatile memory device and an electronic device adapted thereto, according to various embodiments of the present disclosure, is capable of determining whether an LSB backup is required and interrupting, when an LSB backup is not required or is less needed, the LSB backup via a non-volatile memory device. More specifically, when the controller transfers a command for interrupting or executing an LSB backup to the storage device controller of the non-volatile memory device, the storage device controller is capable of interrupting or executing an LSB backup according to the LSB backup interrupt or execute command. For example, an electronic device with a non-removable battery does not need to replace the battery with another, the controller ascertains that the electronic device is not powered off or has a low possibility that the power will be cut off. That is, the electronic device with a non-removable battery may not perform an LSB backup corresponding to a power-off event. By way of comparison to electronic devices with a removable battery, the electronic device with a non-removable battery does not need to perform an LSB backup corresponding to a power-off event, thereby increasing the performance. The method of operating a non-volatile memory device and an electronic device adapted thereto, according to various embodiments of the present disclosure, can control the storage device controller to interrupt the LSB backup and thus increase the performance of the electronic device according to the LSB backup interrupt.

At least part of the method (e.g., operations) or system (e.g., modules or functions) according to various embodiments of the present disclosure can be implemented with instructions as programming modules that are stored in computer-readable storage media. One or more processors can execute instructions, thereby performing the functions. An example of the computer-readable storage media may be the memory. At least part of the programming modules can be implemented (executed) by the processor. At least part of the programming module may include modules, programs, routines, sets of instructions or processes, etc., in order to perform one or more functions.

Examples of computer-readable media include: magnetic media, such as hard disks, floppy disks, and magnetic tape; optical media such as Compact Disc Read Only Memory (CD-ROM) disks and Digital Versatile Disc (DVD); magneto-optical media, such as floptical disks; and hardware devices which are configured to store and perform program instructions (e.g., programming modules), such as read-only memory (ROM), random access memory (RAM), flash memory, etc. Examples of program instructions include machine code instructions created by assembly languages, such as a compiler, and code instructions created by a high-level programming language executable in computers using an interpreter, etc. The described hardware devices may be configured to act as one or more software modules in order to perform the operations and methods described above, or vice versa.

Modules or programming modules according to various embodiments of the present disclosure may include one or more components, remove part of them described above, or include new components. The operations performed by modules, programming modules, or the other components, according to various embodiments of the present disclosure, may be executed in serial, parallel, repetitive or heuristic fashion. Part of the operations can be executed in any other order, skipped, or executed with additional operations.

Although the present disclosure has been described with embodiments, various changes and modifications may be suggested to one skilled in the art. It is intended that the present disclosure encompass such changes and modifications as fall within the scope of the appended claims.

What is claimed is:

1. An electronic device comprising:
a non-volatile memory including:
a Least Significant Bit (LSB) backup module configured to prevent data from being erased, and
a storage device controller configured to control an LSB backup of the LSB backup module;
a battery; and
a processor configured to:
transfer a boot time initialization command to the non-volatile memory,
identify whether the battery is a non-removable battery, and
transfer a command for interrupting an LSB backup to the storage device controller, when the battery is the non-removable battery.

2. The electronic device of claim 1, wherein the processor is further configured to:
perform a determination of whether the LSB backup is required; and
transfer, based on a result of the determination, the command for interrupting or executing the LSB backup to the storage device controller.

3. The electronic device of claim 2, wherein the processor is further configured to determine whether the LSB backup is required based on at least one of the following:
a process of transmission/reception of a threshold amount of data,
a process of processing particular data at a threshold speed, and
a remaining battery capacity of the electronic device.

4. The electronic device of claim 1, wherein the processor is further configured to:
check for a possibility that the electronic device is to be powered off, and
upon ascertaining that there is no possibility that the electronic device is to be powered off, interrupt the LSB backup for the non-volatile memory.

5. The electronic device of claim 4, wherein the processor is further configured to:
determine whether the electronic device is equipped with a removable battery type; and
ascertain that there is no possibility that the electronic device is to be powered off based on a determination that the electronic device is equipped with the non-removable battery.

6. The electronic device of claim 5, wherein the processor is further configured to determine a type of battery equipped within the electronic device based on a code value stored in the non-volatile memory.

7. The electronic device of claim 4, wherein the processor is further configured to:
measure a value sensed by a sensor module equipped within the electronic device;
perform a comparison of the sensed value with a threshold value stored in the non-volatile memory; and
ascertain that there is no possibility that the electronic device is to be powered off based on the comparison of the sensed value with the threshold value.

8. The electronic device of claim 1, wherein the processor is further configured to transfer the command for interrupting an LSB backup to the storage device controller as a request, in response to the boot time initialization command.

9. The electronic device of claim 1, wherein the processor is further configured to control the storage device controller by using at least one of the following:
a process of storing information setting a condition as to whether the LSB backup is required;
a process of altering a voltage applied to an LSB backup circuit; or
a process of cutting off power supplied to the LSB backup circuit.

10. A method of managing a storage device for an electronic device, the method comprising:
transferring a boot time initialization command to a non-volatile memory functionally connected to the storage device;
identifying whether a battery of the electronic device is a non-removable battery; and
transferring a command for interrupting an LSB backup to a storage device controller, when the battery is the non-removable battery.

11. The method of claim 10, further comprising:
determining whether the LSB backup is required; and
transferring, based on a result of the determination, the command for interrupting or executing the LSB backup to the non-volatile memory.

12. The method of claim 11, further comprising:
determining whether the LSB backup is required is performed based on at least one of the following:
a process of transmission/reception of a threshold amount of data,
a process of processing particular data at a threshold speed, and
a remaining battery capacity of an electronic device associated with the storage device.

13. The method of claim 10, further comprising:
checking for a possibility the electronic device is to be powered off; and
upon ascertaining that there is no possibility that the electronic device is to be powered off, interrupting the LSB backup for the non-volatile memory.

14. The method of claim 13, wherein checking the possibility to be powered off in an electronic device comprises:
determining whether the electronic device is equipped with a battery of a non-removable type or a removable type; and
ascertaining that there is no possibility that the electronic device is to be powered off based on a determination that the electronic device is equipped with the non-removable battery.

15. The method of claim 14, wherein determining whether the electronic device is equipped with the battery of the non-removable type or the removable type comprises:
checking the type of battery equipped within the electronic device based on a code value stored in the non-volatile memory.

16. The method of claim 13, wherein checking the possibility that the electronic device is to be powered off comprises:
measuring a value sensed by a sensor module equipped within the electronic device;
performing a comparison of the sensed value with a threshold value stored in the non-volatile memory; and
ascertaining that there is no possibility that the electronic device is to be powered off based on the comparison of the sensed value with the threshold value.

17. The method of claim 10, further comprising:
transferring a command for interrupting the LSB backup to the storage device controller as a request, in response to the boot time initialization command.

18. The method of claim 10, wherein interrupting the LSB backup by the storage device controller comprises:
controlling the storage device controller by using at least one of the following:
a process of storing information setting a condition as to whether the LSB backup is required;
a process of altering a voltage applied to an LSB backup circuit; or
a process of cutting off power supplied to the LSB backup circuit.

19. The method of claim 10, wherein the LSB backup comprises:
storing, by the storage device controller, data stored in a flash memory in a temporary storage space; and
moving the data from the temporary storage space to the non-volatile memory.

20. A non-transitory computer readable medium embodying a computer program, the computer program comprising computer readable program code that, when executed by a processor, causes the processor to:
transfer a boot time initialization command to a non-volatile memory functionally connected to a storage device;
identify whether a battery is a non-removable battery; and
transfer a command for interrupting an LSB backup to a storage device controller, when the battery is the non-removable battery.

\* \* \* \* \*